(12) United States Patent
Dibene, II

(10) Patent No.: US 6,609,914 B2
(45) Date of Patent: Aug. 26, 2003

(54) HIGH SPEED AND DENSITY CIRCULAR CONNECTOR FOR BOARD-TO-BOARD INTERCONNECTION SYSTEMS

(75) Inventor: Joseph T. Dibene, II, San Diego, CA (US)

(73) Assignee: Incep Technologies, Inc., San Diego, CA (US)

( * ) Notice: Subject to any disclaimer, the term of this patent is extended or adjusted under 35 U.S.C. 154(b) by 0 days.

(21) Appl. No.: 09/921,152

(22) Filed: Aug. 2, 2001

(65) Prior Publication Data

US 2002/0016092 A1 Feb. 7, 2002

Related U.S. Application Data

(63) Continuation-in-part of application No. 09/921,153, filed on Aug. 2, 2001, and a continuation-in-part of application No. 09/910,524, filed on Jul. 20, 2001, and a continuation-in-part of application No. 09/802,329, filed on Mar. 8, 2001, and a continuation-in-part of application No. 09/801,437, filed on Mar. 8, 2001, and a continuation-in-part of application No. 09/798,541, filed on Mar. 2, 2001, and a continuation-in-part of application No. 09/785,892, filed on Feb. 16, 2001, and a continuation-in-part of application No. 09/727,016, filed on Nov. 28, 2000, and a continuation-in-part of application No. 09/432,878, filed on Nov. 2, 1999, and a continuation-in-part of application No. 09/353,428, filed on Jul. 15, 1999, now Pat. No. 6,304,450.

(60) Provisional application No. 60/304,930, filed on Jul. 11, 2001, provisional application No. 60/304,929, filed on Jul. 11, 2001, provisional application No. 60/301,753, filed on Jun. 27, 2001, provisional application No. 60/299,573, filed on Jun. 19, 2001, provisional application No. 60/292,125, filed on May 18, 2001, provisional application No. 60/291,772, filed on May 16, 2001, provisional application No. 60/291,749, filed on May 16, 2001, provisional application No. 60/287,860, filed on May 1, 2001, provisional application No. 60/277,369, filed on Mar. 19, 2001, provisional application No. 60/266,941, filed on Feb. 6, 2001, provisional application No. 60/251,184, filed on Dec. 4, 2000, provisional application No. 60/251,223, filed on Dec. 4, 2000, provisional application No. 60/251,222, filed on Dec. 4, 2000, provisional application No. 60/232,971, filed on Sep. 14, 2000, provisional application No. 60/222,407, filed on Aug. 2, 2000, and provisional application No. 60/222,386, filed on Aug. 2, 2000.

(51) Int. Cl.[7] .................................................. H01R 9/09
(52) U.S. Cl. .......................... 439/74; 361/784; 361/785; 361/790
(58) Field of Search ........................ 439/74; 174/138 G; 361/784, 785, 790, 752

(56) References Cited

U.S. PATENT DOCUMENTS

| | | | |
|---|---|---|---|
| 5,065,280 A | | 11/1991 | Karnezos et al. ............ 361/386 |
| 5,345,366 A | * | 9/1994 | Cheng et al. ................ 361/785 |
| 5,355,282 A | * | 10/1994 | Yokemura et al. ........... 361/760 |
| 5,380,211 A | * | 1/1995 | Kawaguchi et al. ........... 439/74 |
| 5,617,300 A | * | 4/1997 | Anzawa et al. .............. 361/795 |
| 5,825,633 A | | 10/1998 | Bujalski et al. .............. 361/804 |
| 6,231,352 B1 | | 5/2001 | Gonzales ...................... 439/66 |

FOREIGN PATENT DOCUMENTS

| | | |
|---|---|---|
| EP | 0 582 145 | 2/1994 |
| JP | 08204304 | 8/1996 |

* cited by examiner

*Primary Examiner*—Michael C. Zarroli
(74) *Attorney, Agent, or Firm*—Knobbe Martens Olson & Bear LLP

(57) ABSTRACT

A system and method for interconnecting circuit boards is disclosed. In one embodiment, a first circuit board connects with a second circuit board via a connector. The first circuit board has an aperture with a plurality of conductive surfaces on an inner surface. At least one of the conductive surfaces is coupled to at least one of a plurality of first circuit board traces. The second circuit board has a plurality of second circuit board traces. Therebetween, the connector has a plurality of conductive signal conductors, each having a first portion disposed at the periphery of the connector and adjacent to the conductive surfaces and a second portion coupled with the second circuit board traces.

34 Claims, 9 Drawing Sheets

HIGH SPEED AND DENSITY CIRCULAR CONNECTOR FOR BOARD-TO-BOARD INTERCONNECTION SYSTEMS

CROSS-REFERENCE TO RELATED APPLICATIONS

This application claims benefit of the following U.S. Provisional Patent Applications, each of which is hereby incorporated by reference herein:

application Ser. No. 60/222,386, entitled "HIGH DENSITY CIRCULAR 'PIN' CONNECTOR FOR HIGH SPEED SIGNAL INTERCONNECT", by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT", by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

application Ser. No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK," by Joseph T. DiBene II, Carl E. Hoge, David H. Hartke, and Edward J. Derian, filed Jul. 11, 2001.

This patent application is also a continuation-in-part of the following co-pending and commonly assigned patent applications, each of which applications are hereby incorporated by reference herein:

application Ser. No. 09/353,428, entitled "INTER-CIRCUIT ENCAPSULATED PACKAGING," by Joseph T. DiBene II and David H. Hartke, filed Jul. 15, 1999, now U.S. Pat. No. 6,304,450, issued on Oct. 16, 2001;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999;

application Ser. No. 09/727,016, entitled "EMI CONTAINMENT USING INTER-CIRCUIT ENCAPSULATED PACKAGING TECHNOLOGY," by Joseph T. DiBene II and David Hartke, filed Nov. 28, 2000, which claims priority to the following U.S. Provisional Patent Applications:

application Ser. No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

application Ser. No. 60/171,065, entitled "INTER-CIRCUIT ENCAPSULATION PACKAGING TECHNOLOGY," by Joseph T. DiBene II and David H. Hartke, filed Dec. 16, 1999;

application Ser. No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled 'HIGH CURRENT MICROPROCESSOR POWER DELIVERY SYSTEMS," by Joseph T. DiBene II, filed Jul. 21, 2000;

application Ser. No. 60/222,386, entitled 'HIGH DENSITY CIRCULAR ' PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000.

Application Ser. No. 09/785,892, entitled 'METHOD AND APPARATUS FOR PROVIDING POWER TO A MICROPROCESSOR WITH INTEGRATED THERMAL AND EMI MANAGEMENT" by Joseph T. DiBene II, David H. Hartke, James J. Hjerpe Kaskade, and Carl E. Hoge, filed Feb. 16, 2001, which claims priority to the following U.S. Provisional Patent Applications:

application Ser. No. 60/183,474, entitled "METHOD AND APPARATUS FOR PROVIDING POWER TO A MICROPROCESSOR WITH INTEGRATED THERMAL AND EMI MANAGEMENT, by Joseph T. DiBene II and David H. Hartke, filed Feb. 18, 2000;

application Ser. No. 60/186,769, entitled "THERMACEP SPRING BEAM," by Joseph T. DiBene II and David H. Hartke, filed Mar. 3, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled 'EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled 'HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY HIGH POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," By Joseph T. DiBene II, David H. Hartke, Carl E. Hoge, James M. Binder, and Joseph S. Riel, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001.

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which claims priority to the following U.S. Provisional Patent Applications:

application Ser. No. 06/185,769, entitled "THERMACEP SPRING BEAM," Joseph T. DiBene II and David H. Hartke, filed Mar. 3, 2000;

application Ser. No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001.

Application Ser. No. 09/801,437, entitled "METHOD AND APPARATUS FOR DELIVERY POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which claims priority to the following U.S. Provisional Patent applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001.

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE," by Joseph T. DiBene II and David H. Hartke, filed Mar. 8, 2001, which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, flied Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001.

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS," by Joseph T. DiBene II, David H. Hartke, Wendell C. Johnson, Farhad Raiszadeh, Edward J. Darien and Jose B. San Andres, filed Jul. 20, 2001, which claims priority to the following U.S. Provisional Patent Applications:

application Ser. No. 60/219,506, entitled "HIGH PERFORMANCE THERMAL/MECHANICAL INTERFACE," by Joseph T. DiBene II, David H. Hartke, and Wendell C. Johnson, filed Jul. 20, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene Ii and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

application Ser. No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK, by Joseph T. DiBene II, Carl E. Hoge, David H. Hartke, and Edward J. Derian, filed Jul. 11, 2001.

Application Ser. No. 09/921,153, entitled "VAPOR CHAMBER WITH INTEGRATED PIN ARRAY," by Joseph T. DiBene II and Farhad Raiszadeh, filed on Aug. 2, 2001, which claims priority to the following U.S. Provisional Patent Applications:

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

application Ser. No. 60/219,813, entitled "HIGH CURRENT MICROPROCESSOR POWER DELIVERY SYSTEMS," by Joseph T. DiBene II, filed Jul. 21, 2000;

application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

application Ser. No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001; and application Ser. No. 60/304,930, entitled "MICRO-I-PAK, by Joseph T. DiBene II, Carl E. Hoge, David H. Hartke, and Edward J. Derian, filed Jul. 11, 2001.

BACKGROUND OF THE INVENTION

1. Field of the Invention

This present invention relates to systems and methods for interconnecting circuit traces and signals between circuit boards, and in particular to a signal interconnection system for transmitting very high-speed signals between devices on such circuit boards.

2. Description of the Related Art

In the past decade, processor and data transmission speeds have increased dramatically. As these speeds continue to increase, there is a corresponding need to provide signal interconnections between printed circuit boards that are compatible with the transmission of such high speed data. At the same time, there is a trend to increase the number of signals carried on printed circuit boards and to decrease the size of the circuit boards. Consequently, the density of signals and circuit traces that carry them is rising. Further, parasitic parameters such as impedance and cross-coupling between interconnection paths typically increase as signal speed and frequency increase.

Thus, it is seen that there is a need for an interconnection system for communicatively coupling circuit traces and components carrying high-speed signals between printed circuit boards that provides high signal density while reducing noise and crosstalk at both the board level and connector level. There is also a need for an interconnection system that provides the foregoing advantages at a low manufacturing cost. The present invention satisfies that need.

SUMMARY OF THE INVENTION

To address the requirements described above, the present invention discloses a system and method for interconnecting circuit boards. The apparatus comprises a first circuit board, having an aperture comprising a plurality of aperture conductive surfaces disposed on an inner surface of the aperture, at least one of the conductive surfaces communicatively coupled to at least one of a plurality of first circuit board traces; a second circuit board, having a plurality of second circuit board traces; and a connector disposed at least partially through the aperture in the first circuit board and between the first circuit board and the second circuit board, the connector having a plurality of conductive signal conductors, each having a first portion disposed at the periphery of the connector and adjacent to the aperture conductive surfaces and a second portion communicatively coupled with the second circuit board traces.

The present invention enables very high speed signals to be transmitted between printed circuit boards (both perpendicular and parallel to each other) with low noise and in a small form factor. The construction is circular in fashion with the signal connections being on the periphery of the connector housing. One side of the signals go down into the PCB where the connector is permanently attached (soldered or press-fit as an example) into one of the two PCBs. The other side extends into a hole drilled into the PCB where multiple connections are provided on the sides of the PCB for signal connection. Because the routing to the connector is completely radial in fashion, this allows signals to funnel into a central point reducing unwanted crosstalk and noise between the signals. The signals on the 'connector' side PCB house spring contacts which interconnect into plated walls on the PCB while providing for radial distribution of the signals to and from devices on the PCB. The radius of the construction may be varied to increase or decrease signal interconnect quantity as needed as well as the pitch of the signal conductors. A shield may be added to the outside of the assembly for reference and noise mitigation. Multiple connectors may be joined in various arrangements for ease in manufacturing and assembly. Additionally, the construction may be designed for right angle applications. And finally, the construction may be used for cable connector arrangements where the conductors are connected to wires in a cable for connections between cables, PCBs, or other connector systems where the interconnect is the same. The interconnect is a circular construction in fashion and utilizes one of the PCBs as the actual connector.

Signals from a device on PCB are transmitted through a PCB to the aforementioned connector. The conductors are arranged such that the signals traverse into the connector in a radial fashion. This lends itself to minimizing crosstalk and other PCB noise due to the radial fashion of the construction forcing signals to separate prior to entering the connector. The signals then traverse through the connector conductors to the upper PCB where they are distributed from the connector in a radial fashion.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1A:
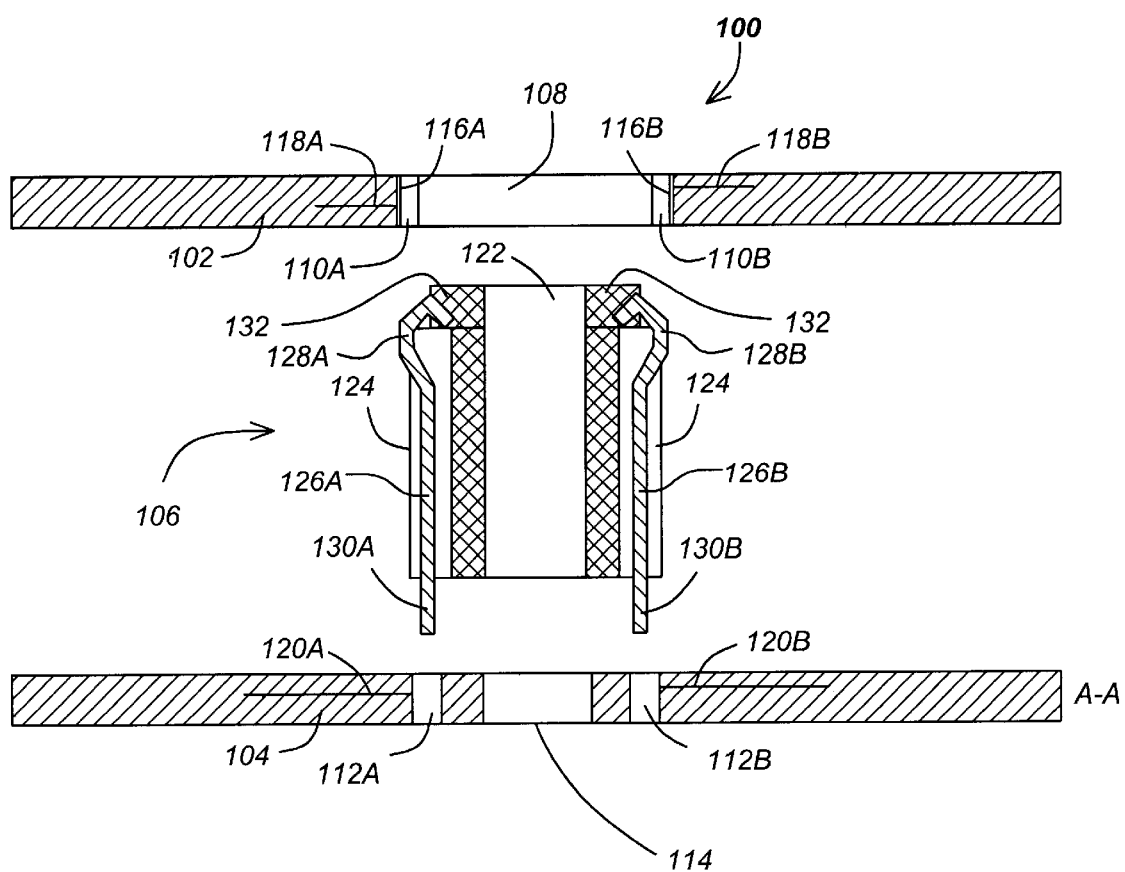
FIG. 1A is a diagram of one embodiment of a circuit board assembly 100.

FIG. 1A is a diagram of one embodiment of a circuit board assembly 100. The circuit board assembly 100 comprises a first circuit board 102 and a second circuit board 104. A connector 106 is disposed between the first circuit board 102 and the second circuit board 104. The connector 106 communicatively couples circuit traces 118A and 118B (alternatively collectively referred to hereinafter as circuit traces 118) in or on the first circuit board 102 and second circuit traces 120A and 120B (hereinafter alternatively collectively referred to as second circuit traces 120) in or on the second circuit board 104.

The first circuit board 102 includes an aperture 108. The aperture 108 includes conducting surfaces 116A and 116B (hereinafter alternatively collectively referred to as conducting surfaces 116) communicatively coupled to the circuit traces 118. Similarly, in the embodiment disclosed in FIG. 1A, the second circuit board 104 includes one or more second circuit board apertures 112 or through-holes which allow permanent mounting of the connector 106 to the second circuit board 104. The second circuit board 104 also includes a through-hole 114 that permits insertion of a mechanical fastener to couple the connector 106 to the second circuit board 104 (and, if desired to the first circuit board 102). The second circuit board 104 also includes apertures 112A and 112B (hereinafter alternatively collectively referred to as apertures 112) such as through-holes. In one embodiment, the apertures 112 are plated with conductive material, and are communicatively coupled to circuit traces 120A and 120B in or on the second circuit board 104.

The connector 106 includes a substantially non-conducting housing 124 and a plurality of conductive signal conductors 126A and 126B (hereinafter alternatively referred to as signal conductors 126) disposed on a periphery of the housing 124. In the illustrated embodiment, the signal conductors 126A and 126B include a first portion 128A and 128B, respectively and second portions 130A and 130B, respectively. The first portions 128A and 128B each include a spring structure which, when the connector 106 is placed within the aperture 108, is urged against the conductive surfaces 116A and 116B, respectively on the inner surface of the aperture 108, thus communicatively coupling the signal conductor second portions 130A and 130B with signal traces 118A and 118B. Further, when the connector 106 is communicatively coupled to the second circuit board (e.g. by communicatively coupling the signal conductor second portions 130A and 130B to plated apertures 112A and 112B, respectively), communicative coupling is established between circuit board traces 120A and 118A and between circuit board traces 120B and 118B.

In one embodiment, the non-conductive housing 124 is a molded plastic material, and the signal conductors 126 are molded into the housing. The second portion 130 of the signal conductors 126 are securely held by the housing 124 for mounting to the second circuit board 104 and the first portion 128 of the signal conductors 126 are spring-loaded by the cap 132. The cap can be a separate structure, or may be integrated with the housing 124.

In one embodiment, the connector 106 further comprises a cap 132. The cap 132 can be inserted into the housing, thus urging the spring structure away from the housing 124 to facilitate contact with the conductive surfaces 116A and 116B of the first circuit board 102 when the connector 106 is inserted into the aperture 108. The cap 132 may also include an aperture 122 disposed therethrough, to allow insertion of a screw or other fastener.

Figure 1B:
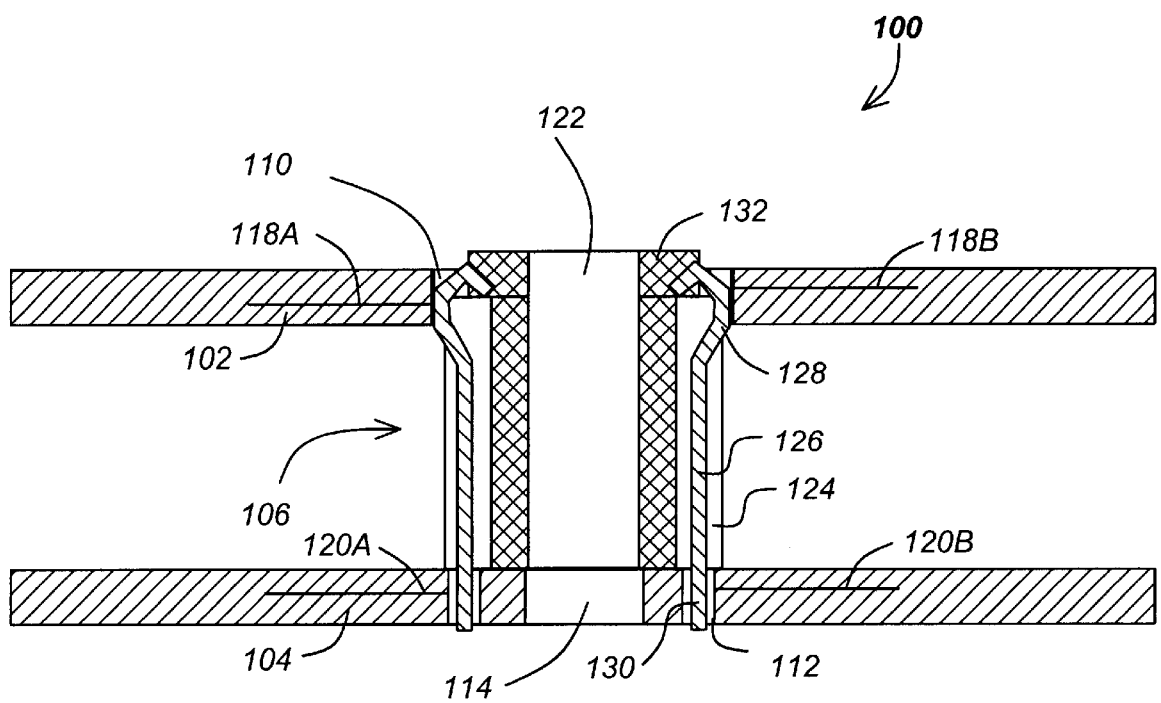
FIG. 1B is a diagram showing an assembled view of the structures disclosed in FIG. 1A.

FIG. 1B is a diagram showing an assembled view of the structures disclosed in FIG. 1A.

Figure 2A:
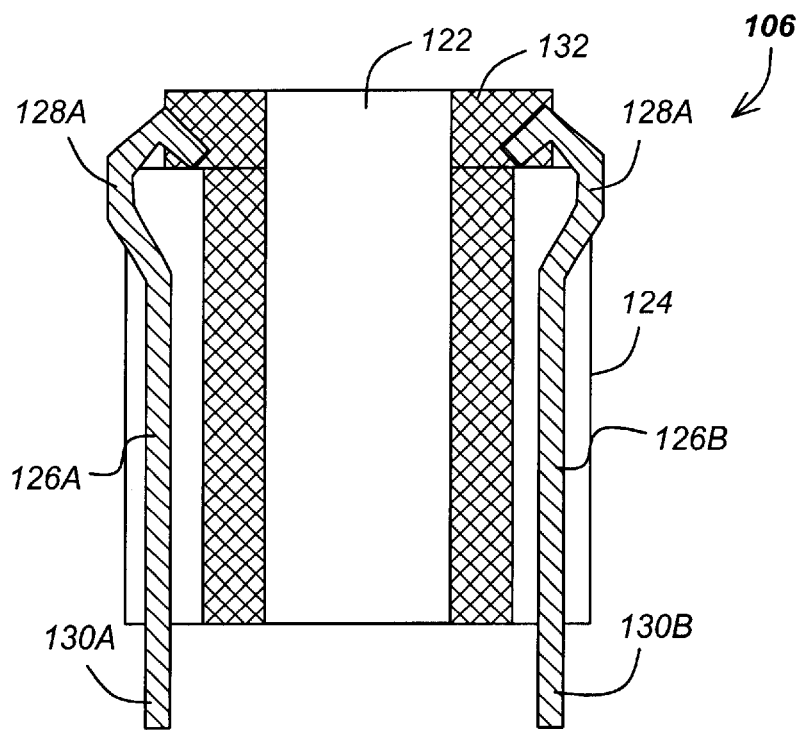
FIG. 2A is a diagram presenting a side view of additional detail regarding one embodiment of the connector.

FIG. 2A is a diagram presenting a side view of additional detail regarding one embodiment of the connector 106.

Figure 2B:
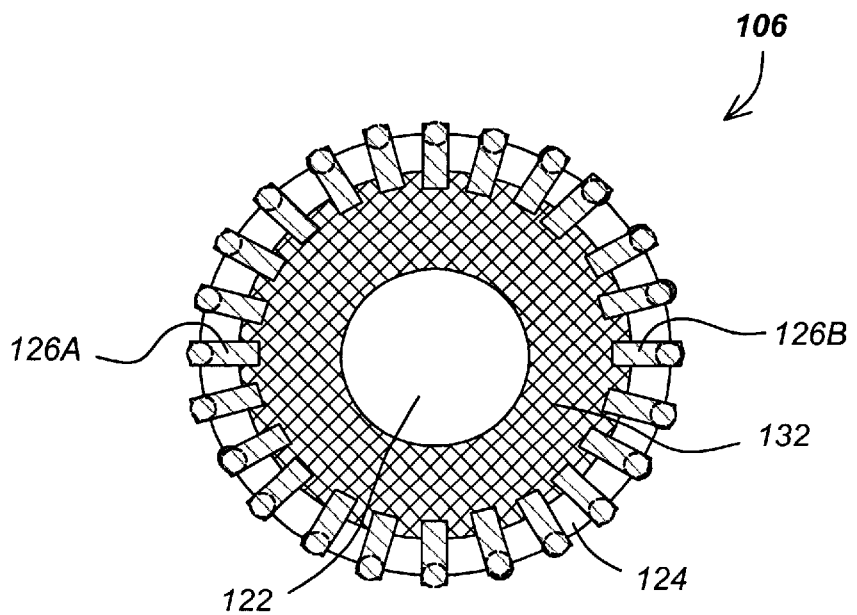
FIG. 2B is a diagram presenting a top view of one embodiment of the connector.

FIG. 2B is a diagram presenting a top view of one embodiment of the connector 106. In this embodiment, the signal conductors 126 are radially and equidistantly disposed about the periphery of the connector 106. FIG. 2B also shows that the cross section of the connector 106 (and the aperture 108) is circular. However, the connector 106 may have different cross-sectional shapes, including ovoid, elliptical, trapezoidal, rectangular, or square. Further, the signal conductors 126 can be disposed in any pattern as desired for the particular signal carried on the signal conductor 126. Hence, any or all of the signal conductors 126 can be thicker than those illustrated. Further, the spacing between each of the signal conductors 126 can be greater or less than illustrated, and need not be constant across all angles (i.e. some signal conductors 126 may be closer together than others).

Figure 3A:
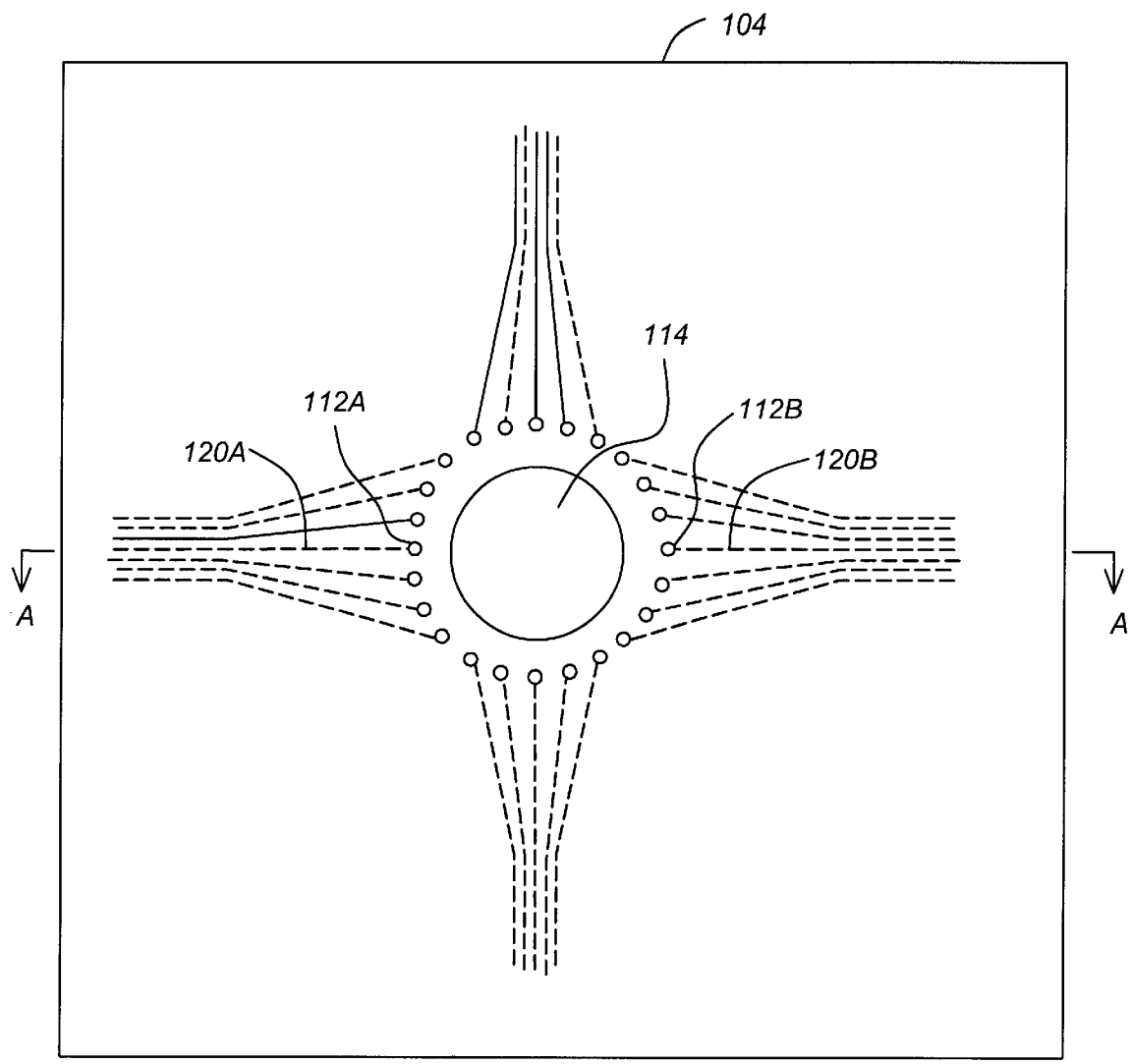
FIG. 3A is a diagram illustrating a top view of one embodiment of the second circuit board, showing how signal traces can be routed to and from the connector.

FIG. 3A is a diagram illustrating a top view of one embodiment of the second circuit board 104, showing how signal traces 120A and 120B can be routed to and from the connector 106. For purposes of illustration, the signal traces 120 on the second circuit board 104 are presented. As illustrated, the circuit board 104 can be a multi-layer circuit board, with signal traces on different layers.

Figure 3B:
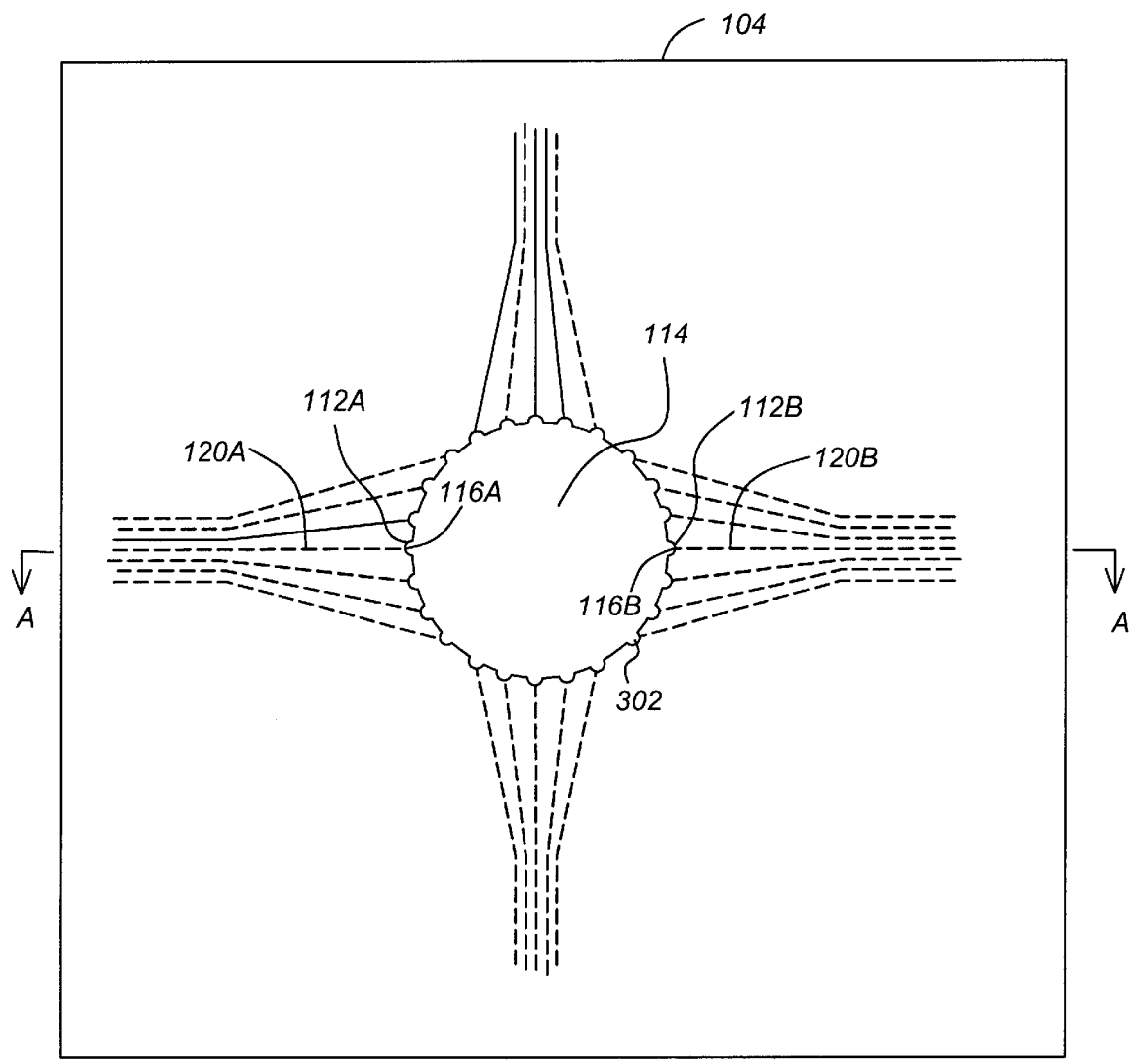
FIG. 3B is a diagram illustrating a top view of one embodiment of the first circuit board, showing how signal traces can be routed to and from the connector.

FIG. 3B is a diagram illustrating a top view of one embodiment of the first circuit board 102, showing how signal traces 118A and 118B can be routed to and from the connector 106. In this embodiment, the aperture 108 comprises a plurality of concave portions 302 which can be formed from plated vias. These concave portions (which include aperture conductive surfaces 116) or partial vias or plated through-holes can be formed by drilling through holes, and cutting through the through holes to form the aperture 108, and plating the inner surfaces of the concave remainder from the through holes to make electrical contact with the inner layers of the circuit board 102. Alternatively, the through holes can be plated first, then cut to form the aperture 108.

Figure 4:
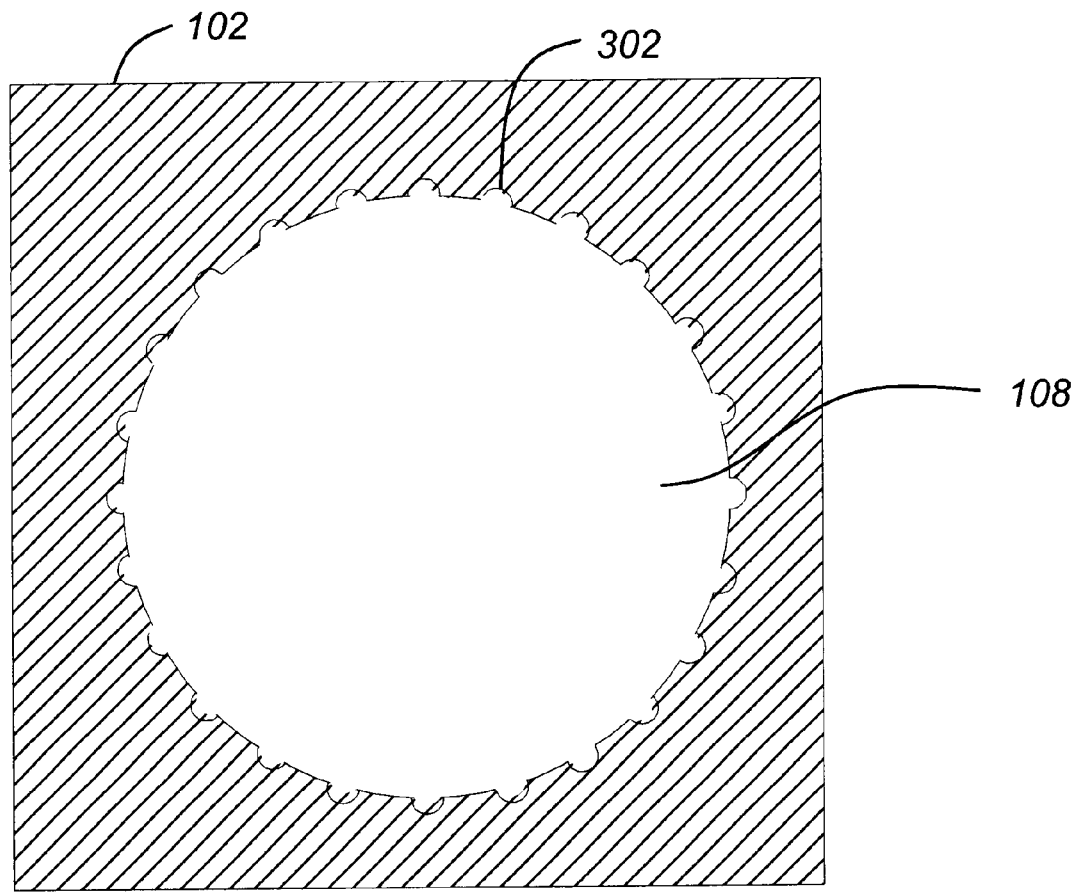
FIG. 4 is a diagram illustrating another top view of the first circuit board and aperture.

FIG. 4 is another diagram illustrating a top view of one embodiment of the first circuit board and aperture.

Figure 5:
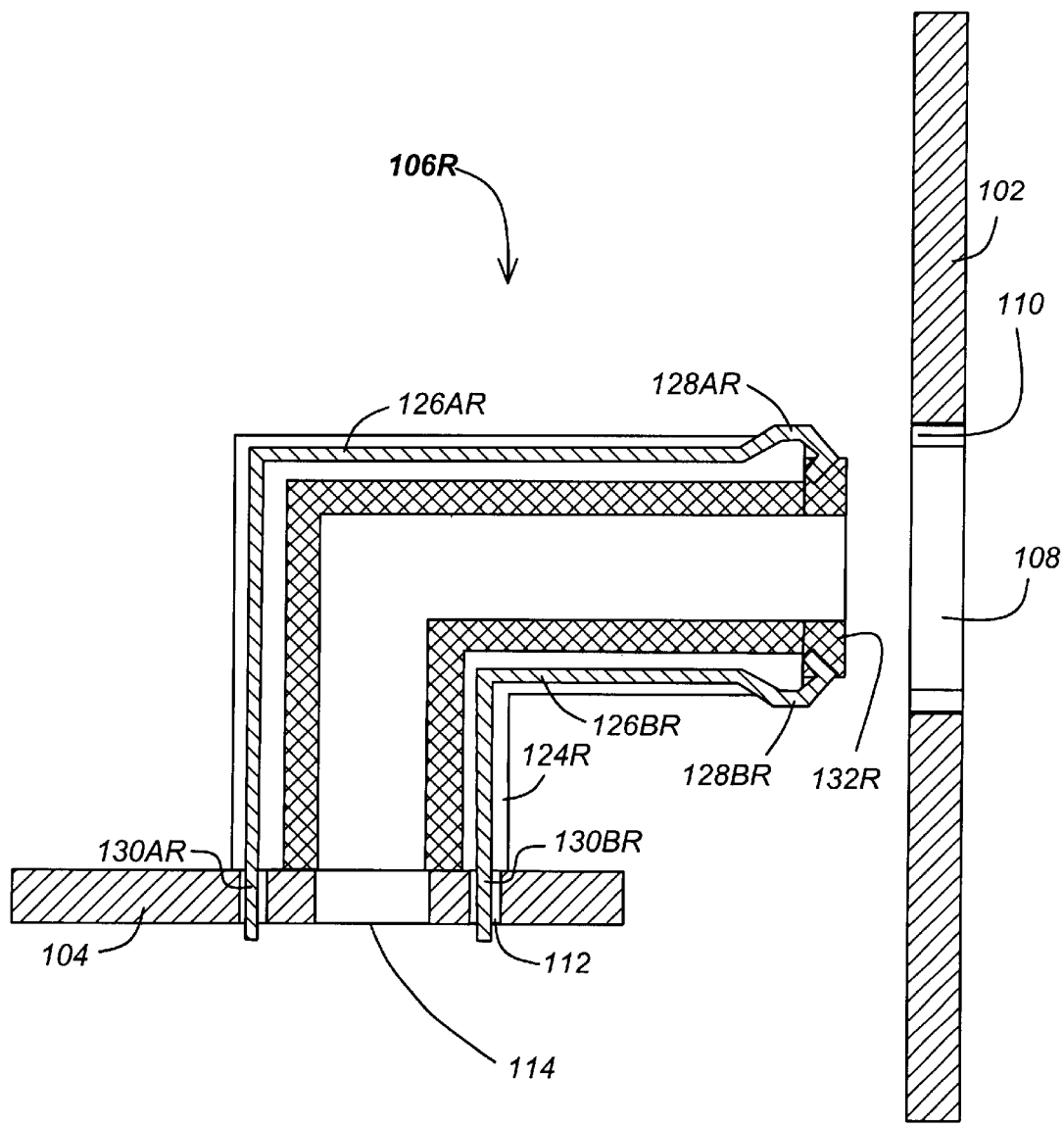
FIG. 5 is a diagram illustrating an "L" shaped connector.

FIG. 5 is a diagram presenting another embodiment of the present invention. This embodiment comprises a right angle or "L" shaped connector 106R disposed between the first circuit board 102 and the second circuit board 104. This embodiment is useful in applications where electrical connection is required between circuit boards that are disposed approximately 90 degrees from one another, such as with a backplane circuit board and a component circuit board or a mother board and component boards. In this embodiment, the angle connector 106R comprises a housing 124R having a plurality of right angle signal conductors 126AR and 126BR (hereinafter alternatively collectively referred to as right angle signal conductor(s) 126R) disposed on the periphery of the housing. Each of the signal conductors 126R include a first portion 128R with a spring structure and a second portion 130 for communicatively coupling to the second circuit board 104.

Figure 6:
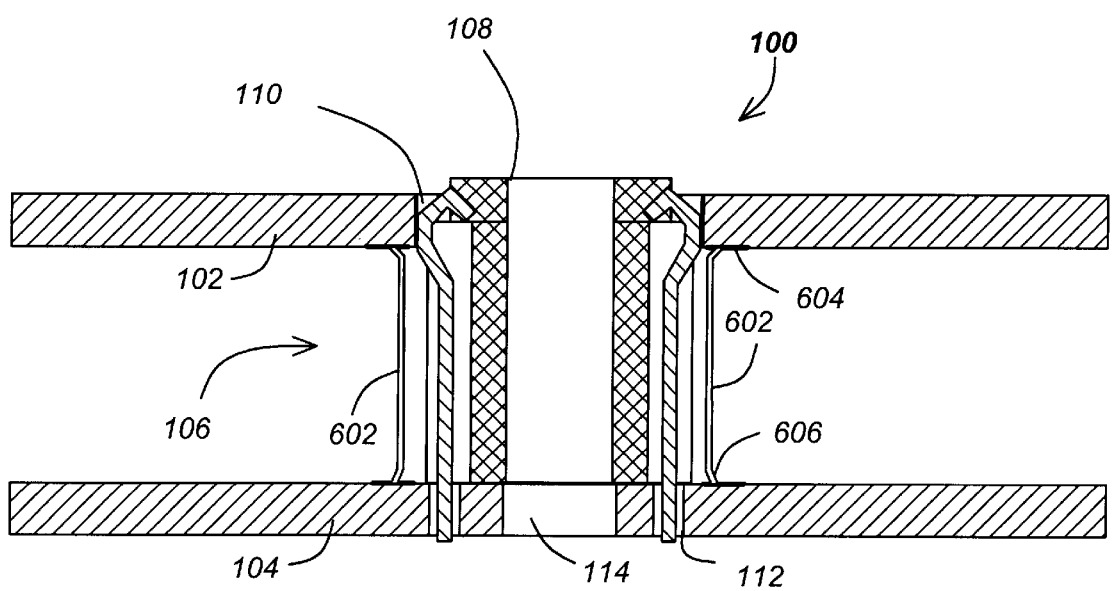
FIG. 6 is a diagram presenting an embodiment having a conductive shield.

FIG. 6 is a diagram presenting another embodiment of the present invention. In this embodiment, a conductive shield 602 is placed between the first circuit board 102 and the second circuit board 104 and surrounding the connector 106. The shield 602 is communicatively coupled to a conductive surface 604 on the first circuit board 102 and a conductive surface 606 on the second circuit board 104. The conductive surfaces can be communicatively coupled to ground planes or other circuit elements in the first circuit board 102 and/or the second circuit board 104 to reduce signals and noise emanating from the connector 106 and or entering the connector 106.

Figure 7A:
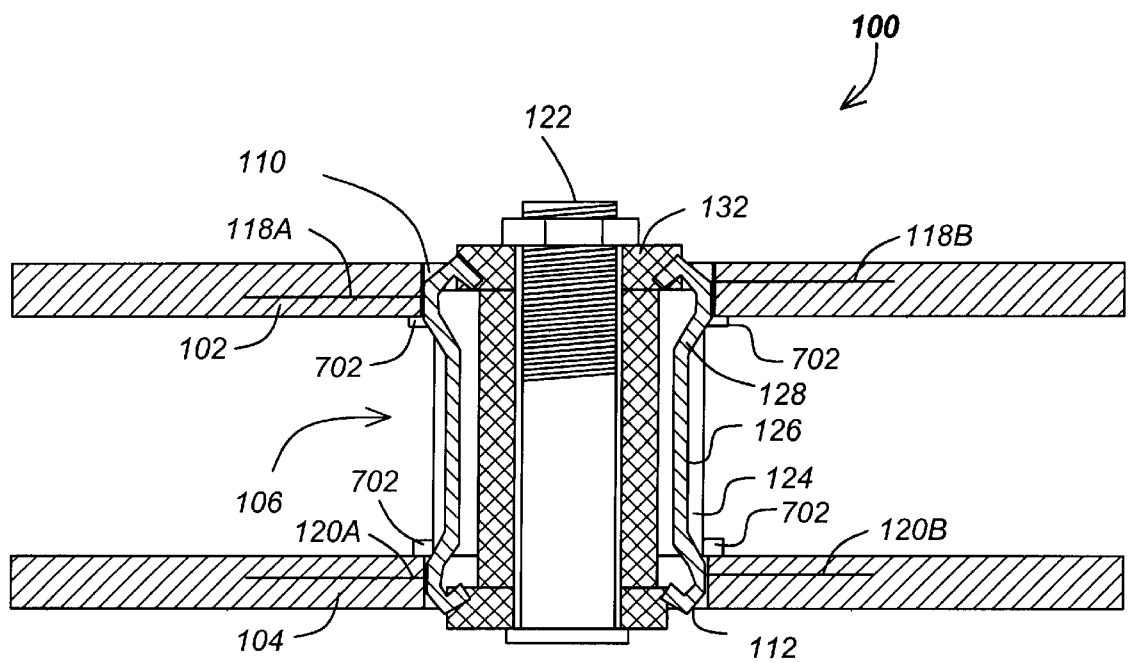
FIGS. 7A and 7B are diagrams presenting an embodiment with spring contacts on both sides of the connector.
Figure 7B:
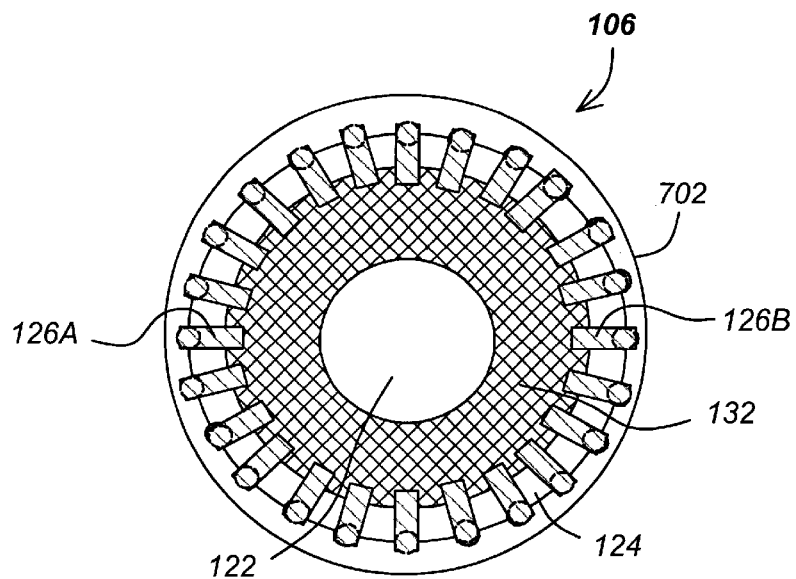

FIGS. 7A and 7B are diagrams of another embodiment of the present invention. In the embodiments described above, spring members are used to contact the inner side of an aperture in the first circuit board 102 and a different contact structure is used for electrical coupling with the second circuit board 104. FIG. 7A is a diagram of an embodiment in which the connector 106 includes spring contacts on both ends. In this embodiment, both the first circuit board 102 and the second circuit board 104 would include an aperture having conductive surfaces. The assembly can then be held in place with one or more standoffs, fasteners, or similar devices. In one embodiment, the housing 702 includes a lip 702 or similar structure which prevents the first circuit board 102 and the second circuit board 704 from coming together. Standoffs can also be placed between the first circuit board 102 and the second circuit board 104 for this purpose.

Although the illustrated embodiment depict a system wherein spring structures on the connector effect contact with conductive surfaces on one of the circuit boards, the present invention can be implemented without such spring structures, or can be implemented with spring structures disposed on the circuit board, rather than the connector.

Conclusion

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A circuit board assembly, comprising:
a first circuit board, having an aperture comprising a plurality of aperture conductive surfaces disposed on an inner surface of the aperture, at least one of the conductive surfaces communicatively coupled to at least one of a plurality of first circuit board traces;
a second circuit board, having a plurality of second circuit board traces; and
a connector disposed at least partially through the aperture and between the first circuit board and the second circuit board, the connector having a plurality of conductive signal conductors, each having a first portion disposed at the periphery of the connector and adjacent to the aperture conductive surfaces and a second portion communicatively coupled with the second circuit board traces.

2. The apparatus of claim 1, wherein:
the connector further comprises a non-conductive housing; and
the plurality of conductive signal conductors are disposed about the periphery of the housing.

3. The apparatus of claim 1, wherein:
the conductive signal conductor first portion is a spring portion springingly urged against the aperture conductive segments when the connector is disposed at least partially through the aperture.

4. The apparatus of claim 3, wherein:
each of the second signal conductor second portions comprise a pin portion distal from the spring portion; and
the second circuit board comprises a plurality of second circuit board apertures communicatively coupled to the second circuit board traces, the apertures configured to accept the pin portions.

5. The apparatus of claim 4, wherein the second circuit board apertures each comprise a conductive surface communicatively coupled to the pin portion.

6. The apparatus of claim 2, further comprising a cap, disposed in the housing, the cap having a surface urging the spring portion of the signal conductors towards the aperture conductive surfaces.

7. The apparatus of claim 1, wherein the aperture comprises a plurality of concave portions and each of the aperture conductive surfaces are disposed in the concave portions.

8. The apparatus of claim 7, wherein the concave portions are formed at least partially from plated vias.

9. The apparatus of claim 1, wherein the connector is "L" shaped.

10. The apparatus of claim 1, wherein the conductive surfaces are spaced a constant distance apart.

11. The apparatus of claim 1, wherein the aperture conductive surfaces are spaced apart according to a variable distance.

12. The apparatus of claim 1, further comprising a shield disposed external to the connector, the shield electrically connecting one of the signal traces in the first circuit board and one of the signal traces in the second circuit board.

13. The apparatus of claim 12, wherein the shield comprises a spring section.

14. The apparatus of claim 1, further comprising a shield disposed internal to the connector.

15. The apparatus of claim 1, wherein the second portion is communicatively coupled to the second circuit board traces via wires communicatively coupled to the second circuit board traces.

16. A connector for communicatively coupling a first circuit board having an aperture comprising a plurality of conductive surfaces disposed on an inner surface of the aperture and a second circuit board, comprising:
the connector disposed at least partially through the aperture and between the first circuit board and the second circuit board, the connector having
a plurality of conductive signal conductors, each having
a first portion disposed at the periphery of the connector and adjacent to the aperture conductive surfaces; and
a second portion in communication with the second circuit board traces.

17. The apparatus of claim 16, wherein:
the connector further comprises a non-conductive housing; and the plurality of conductive signal conductors are disposed about the periphery of the housing.

18. The apparatus of claim 16, wherein:

the conductive signal conductor first portion is a spring portion springingly urged against the aperture conductive segments when the connector is disposed at least partially through the aperture.

19. The apparatus of claim 18, wherein:

the conductive signal conductor second portion comprises a pin portion distal from the spring portion; and the second circuit board comprises a plurality of second circuit board apertures communicatively coupled to the second circuit board traces, the apertures configured to accept the pin portions.

20. The apparatus of claim 19, wherein the second circuit board apertures each comprise a conductive surface communicatively coupled to the pin portion.

21. The apparatus of claim 17, further comprising a cap, disposed in the housing, the cap having a surface urging the spring portion of the signal conductors towards the aperture conductive surfaces.

22. The apparatus of claim 16, wherein the aperture comprises a plurality of concave portions and each of the aperture conductive surfaces are disposed in the concave portions.

23. The apparatus of claim 22, wherein the concave portions are formed at least partially from plated vias.

24. The apparatus of claim 16, wherein the connector is "L" shaped.

25. The apparatus of claim 16, wherein the conductive surfaces are spaced a constant distance apart.

26. The apparatus of claim 16, wherein the aperture conductive surfaces are spaced apart according to a variable distance.

27. The apparatus of claim 16, further comprising a shield disposed external to the connector, the shield electrically connecting one of the signal traces in the first circuit board and one of the signal traces in the second circuit board.

28. The apparatus of claim 27, wherein the shield comprises a spring section.

29. The apparatus of claim 16, further comprising a shield disposed internal to the connector.

30. The apparatus of claim 16, wherein the second portion is communicatively coupled to the second circuit board traces via wires communicatively coupled to the second circuit board traces.

31. The apparatus of claim 23, wherein the aperture and concave potions are formed by forming plated vias in the first circuit board, then cutting between the vias.

32. A circuit board assembly, comprising:

a first circuit board, having an aperture, the aperture comprising
 a plurality of conductive surfaces radially disposed about an inner surface of the aperture, each of the conductive surfaces communicatively coupled to at least one of a plurality of first circuit board traces;

a connector, having a first portion disposable at least partially through the aperture, the connector having
 a non-conductive housing;
 a plurality of conductive signal conductors, each signal conductor having a spring portion and a pin portion distally disposed from the spring portion, wherein the spring portion is arranged peripherally about the housing, the spring portions springingly contacting the plurality of conductive surfaces of the first circuit board when the connector is inserted into the aperture; and
 a cap, disposed in the housing, wherein the cap urges the spring portion of the signal conductors towards the aperture conductive surfaces;

a second circuit board, having a plurality of apertures communicatively coupled to second circuit board signal traces, the apertures configures to accept and become communicatively coupled with the signal conductor pin portions.

33. The apparatus of claim 16, wherein the plurality of conductive surfaces comprises more than two conductive surfaces.

34. The apparatus of claim 1, wherein the plurality of aperture conductive surfaces comprises more than two conductive surfaces.

* * * * *